United States Patent
Schröter et al.

(10) Patent No.: US 10,393,845 B2
(45) Date of Patent: Aug. 27, 2019

(54) SIGNAL TRANSMITTER FOR PILOT TONE NAVIGATION

(71) Applicants: Steffen Schröter, Fürth (DE); Jan Bollenbeck, Eggolsheim (DE); Matthias Fenchel, Erlangen (DE); Peter Speier, Erlangen (DE); Markus Vester, Nürnberg (DE)

(72) Inventors: Steffen Schröter, Fürth (DE); Jan Bollenbeck, Eggolsheim (DE); Matthias Fenchel, Erlangen (DE); Peter Speier, Erlangen (DE); Markus Vester, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 181 days.

(21) Appl. No.: 15/368,607

(22) Filed: Dec. 3, 2016

(65) Prior Publication Data
US 2017/0160367 A1  Jun. 8, 2017

(30) Foreign Application Priority Data

Dec. 3, 2015 (DE) .................. 10 2015 224 158

(51) Int. Cl.
*G01R 33/36* (2006.01)
*G01R 33/565* (2006.01)

(52) U.S. Cl.
CPC ... *G01R 33/56509* (2013.01); *G01R 33/3607* (2013.01); *G01R 33/3614* (2013.01); *G01R 33/3657* (2013.01); *G01R 33/3692* (2013.01)

(58) Field of Classification Search
CPC .......... G01R 33/56509; G01R 33/3607; G01R 33/3614; G01R 33/3657; G01R 33/3692

(Continued)

(56) References Cited

U.S. PATENT DOCUMENTS

| 7,123,009 B1 * | 10/2006 | Scott ................... G01R 33/3621 |
| | | 324/311 |
| 7,447,534 B1 * | 11/2008 | Kingsley .............. A61B 5/0408 |
| | | 600/183 |

(Continued)

FOREIGN PATENT DOCUMENTS

| DE | 102015203385 A1 | 8/2016 | |
| WO | WO-2015150953 A1 * | 10/2015 | ......... G01R 33/3692 |
| WO | WO2015150953 A1 | 10/2015 | |

OTHER PUBLICATIONS

Schroeder et al., Two-Dimensional Respiratory Motion Characterization for Continuous MR Measurements Using Pilot Tone Navigation. Proc. Intl. Soc. Mag. Reson. Med. 24 (Year: 2016).*

(Continued)

*Primary Examiner* — Jermele M Hollington
*Assistant Examiner* — Sean Curtis
(74) *Attorney, Agent, or Firm* — Lempia Summerfield Katz LLC

(57) ABSTRACT

A transmitter for pilot tone navigation in a magnetic resonance tomography system includes a power supply and an antenna. The transmitter is configured to transmit a pilot tone signal via the antenna. The transmitter also includes a decoupling element in order to protect a transmitter output from signals that the antenna receives with excitation pulses of the magnetic resonance tomography system during a magnetic resonance tomography. In a method, movement-dependent changes to the pilot tone signal of the transmitter are identified by a controller of the magnetic resonance tomography system.

17 Claims, 3 Drawing Sheets

(58) Field of Classification Search
USPC .................................................. 324/300–309
See application file for complete search history.

(56) References Cited

U.S. PATENT DOCUMENTS

| | | | | |
|---|---|---|---|---|
| 7,750,635 | B2* | 7/2010 | Van Helvoort | G01R 33/3415 324/318 |
| 9,784,805 | B2* | 10/2017 | Saes | G01R 33/341 |
| 10,122,507 | B2* | 11/2018 | Nishimoto | H04L 5/0048 |
| 2004/0086006 | A1* | 5/2004 | Tanikoshi | H01S 5/06804 372/29.02 |
| 2004/0161249 | A1* | 8/2004 | Suda | H04B 10/503 398/198 |
| 2009/0267601 | A1* | 10/2009 | Van Helvoort | G01R 33/3415 324/309 |
| 2010/0259261 | A1* | 10/2010 | Saes | G01R 33/341 324/309 |
| 2016/0245888 | A1* | 8/2016 | Bollenbeck | G01R 33/56308 |
| 2017/0160367 | A1* | 6/2017 | Schroter | G01R 33/3607 |
| 2019/0049533 | A1* | 2/2019 | Popescu | G01R 33/307 |

OTHER PUBLICATIONS

Schroeder et al., A Novel Method for Contact-Free Cardiac Synchronization Using the Pilot Tone Navigator. Proc. Intl. Soc. Mag. Reson. Med. 24 (Year: 2016).*

Bacher, Mario. Cardiac Triggering Based on Locally Generated Pilot-Tones in a Commercial MRI Scanner: A Feasibility Study. Institute for Medical Engineering—Graz University of Technology (Year: 2017).*

German Office Action for German Application No. 10 2015 224 158.0, dated Aug. 24, 2016, with English Translation.

* cited by examiner

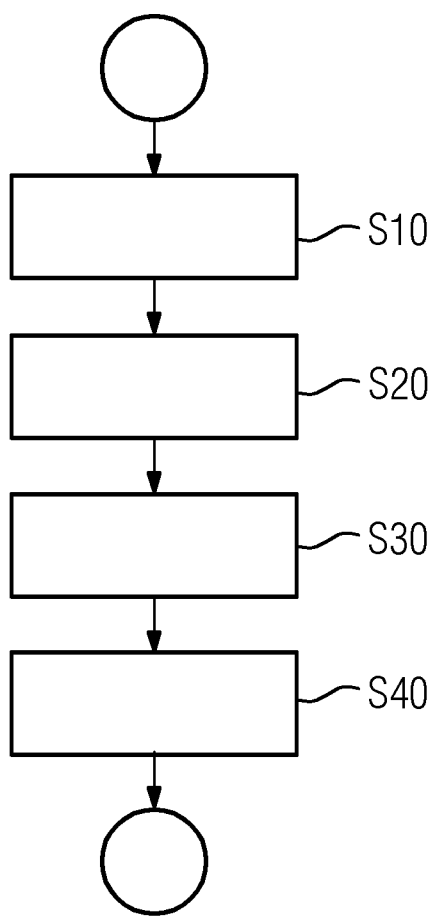

SIGNAL TRANSMITTER FOR PILOT TONE NAVIGATION

This application claims the benefit of DE 10 2015 224 158.0, filed on Dec. 3, 2015, which is hereby incorporated by reference in its entirety.

BACKGROUND

The present embodiments relate to a transmitter for pilot tone navigation in a magnetic resonance tomography system and to a method for identifying patient movements.

Magnetic resonance tomography systems are imaging apparatuses that, in order to map an examination object, align the nuclear spins of the examination object with a strong outer magnetic field and by a magnetic alternating field excite the same for precession about this alignment. The precession or return of the spins from this excited state into a state with less energy generates, as a response, a magnetic alternating field that is received via antennae.

With the aid of magnetic gradient fields, a spatial encoding is impressed onto the signals, which then permits an assignment of the received signal to a volume element. The received signal is then evaluated, and a three-dimensional imaging representation of the examination object is provided.

Depending on the pulse sequence used, also referred to as sequence, the image capture in a magnetic resonance tomography system requires a number of milliseconds up to seconds. A longer capture time usually results in minimal noise artifacts. The image capture may be started in each case at the start of a phase, in which the body remains relatively still, in order to avoid motion artifacts due to a movement during the image capture. Unavoidable movements are, for example, breathing and heartbeat. However, a phase of relative rest (e.g., after breathing out or a contraction of the cardiac muscle) also follows a phase with movements. An image capture in this phase is to expect a relatively long time frame with few movements so that the best measurement results are to be expected.

It is known to capture the movements using mechanical sensors or using electrodes, for example, that measure the excitation potential of the muscles.

The German patent application with the application reference number 102015203385 describes a basic method of capturing the movements using a high-frequency signal. The signal is permanently captured in a patient recording of a magnetic resonance tomography system, and signal changes due to movements (e.g., due to changing interferences or damping) are evaluated. A movement of the patient, caused by breathing or heartbeat, may then be identified from certain patterns of this signal.

The surrounding area of a magnetic resonance tomography system with respect to the irradiation stability is challenging, at the same time the method used places particular demands on the signal source, in order to enable movements to be easily identified.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a suitable method of establishing movements and a signal source for the method are provided.

In one embodiment, a transmitter for pilot tone navigation in a magnetic resonance tomography system includes a power supply and an antenna. The transmitter is configured to emit a pilot tone signal in the form of an electromagnetic alternating field by way of the antenna. The transmitter includes a decoupling element that decouples the transmitter output of signals that the antenna in a magnetic resonance tomography system receives by excitation pulses of the magnetic resonance tomography system.

In the recording region of the magnetic resonance tomography system, high-frequency fields with a power in the range of kilowatts are generated in order to excite the nuclear spins. The power possibly destroys an unprotected electronics module of a transmitter (e.g., if this is connected to an antenna) that is exposed to the external high-frequency field. The decoupling element provides that the transmitter output is decoupled from excitation pulses irradiated via the antenna and may not be destroyed hereby.

The method of identifying a movement of a patient using a magnetic resonance tomography system is embodied with a transmitter of one or more of the present embodiments. The method includes the act such that the transmitter is arranged in close proximity to the heart or the lungs of the patient (e.g., on a body surface of the patient at a minimal distance from the organs). In a further act, the transmitter transmits the pilot tone signal. In another act, the magnetic resonance tomography system receives the pilot tone signal. To this end, the magnetic resonance tomography system may use one or a number of antennae and receivers that are also provided to receive a magnetic resonance signal. In one embodiment, the pilot tone signal includes a frequency in a frequency range about the Larmor frequency (e.g., in a range with a variance of less than 10 percent). In one act, a controller of the magnetic resonance tomography system identifies a movement-dependent change in the received pilot tone signal using signal analysis. For example, a movement may occur by identifying a variation in the amplitude of the pilot tone signal, caused by changes to the local coil load or the change in superimpositions or damping due to the movement of the body or organ. The movement may be differentiated from other disturbing influences by the specific frequency and signal profile of a respiratory movement and a heartbeat.

The transmitter with a corresponding resistance against the excitation pulse permits the source of the pilot tone signal to be arranged in close proximity to the cause of the movement (e.g., on the body surface at a minimal distance from the heart and/or lungs) in the recording region of the magnetic resonance tomography system. The influence of the movement on the pilot tone signal is thus advantageously maximized.

In possible embodiment of the transmitter, the decoupling element includes a diode or another component with a non-linear characteristic curve. The component may have a high internal resistance with a low voltage and a lower internal resistance with a higher voltage.

A non-linear characteristic curve permits a signal generated by the transmitter and routed to the antenna at the transmitter output to be barely be damped on account of the minimal amplitude required for the pilot tone signal method, whereas an excitation pulse of the magnetic resonance tomography system at the transmitter output is reduced to a safe voltage (e.g., to the through voltage of a diode). The transmitter is thus advantageously secured against destruction by the excitation pulse.

In one embodiment of the transmitter, the decoupling element includes an element with a frequency-dependent characteristic curve. A high-, low- or band-pass filter may be provided between the transmitter output and antenna, for example. The limit frequency of the filter may lie between the frequency of the excitation pulse (e.g., the Larmor frequency) and the frequency of the pilot tone signal. The steepness of the filter is selected to be so great that the voltage generated by the excitation pulse on the antenna at the transmitter output is damped to a safe degree and, at the same time, the pilot tone signal is damped only marginally (e.g., by at most 3 dB, 6 dB or 12 dB). For example, a quartz filter or a surface acoustic wave filter has an adequate steepness in the characteristic curve.

The frequency-dependent characteristic curve may permit a lower damping of the pilot tone signal compared with, for example, a diode, and may thus minimize the energy consumption of the transmitter. If this is a band-pass filter, the quality of the pilot tone signal with respect to bandwidth and harmonic waves is improved at the same time.

In one embodiment of the transmitter, the power supply has a photoelement.

The photoelement advantageously permits energy to be permanently supplied to the transmitter without using metallic conductors that have a disruptive influence on the high-frequency fields during a magnetic resonance recording (e.g., via a light guide made of glass fiber or plastic).

In one embodiment of the transmitter, the photoelement is configured to receive the signal of a high-frequency modulated light source and to convert the signal into a high-frequency alternating current. The transmitter may then emit at least one part of the energy of the high-frequency alternating current as an electromagnetic alternating field of the same frequency via the antenna solely using passive components (e.g., coils, capacitors or filters).

In one embodiment, the transmitter in the recording region thus has a minimum number of components and may, at the same time, indefinitely send using a glass or polymer fiber, which routes a light beam modulated with the pilot tone signal. For example, the light beam may be obtained from a transmit signal of a transmit channel of the magnetic resonance tomography system by a simple converter.

In one embodiment of the transmitter, the transmitter includes a signal link that may be coupled to a magnetic resonance tomography system. The transmitter is configured to convey an item of identification to the magnetic resonance tomography system by the signal link.

The transmitter may convey an item of identification via the signal link, so that the magnetic resonance tomography system may provide a receipt of the pilot tone signal, for example, or may transmit a pilot tone signal for transmission to the transmitter via the signal link. The signal link may be a cable link with a plug, for example. The item of information may be an item of identification that is conveyed by potentials to poles or the plug or via the cable.

In one embodiment of the transmitter, this has a frequency-stable local oscillator.

A local oscillator enables a fully autonomous operation of the transmitter, so that no links to the magnetic resonance tomography system are required. A frequency-stable local oscillator keeps the frequency of the pilot tone signal constant so that a movement by a change in phase may also be identified. A relative change in frequency (e.g., change in frequency/frequency) of less than $5*10^{-6}$ while monitoring a movement may be regarded as frequency stable.

In one embodiment, the transmitter includes a modulator configured to modulate a signal transmitted via the antenna as a function of a status parameter of the transmitter.

For example, the status parameter may be an operating voltage of the power supply such as a battery, an accumulator, or a super capacitor. In one embodiment, the pilot tone signal may be modulated as a function of the voltage, so that the magnetic resonance tomography system may identify, by a demodulation, if a function is no longer provided. Analog methods (e.g., by a voltage-dependent frequency being modulated up or digital methods such as BPSK) may be provided as modulation.

In one possible embodiment of the transmitter, the transmitter includes a switch element. The switch element is configured to activate the transmitter as a function of a surrounding area parameter.

The switch element permits the transmitter to only activate and thus consume energy and emit high-frequency if the transmitter is located in a recording region. Two embodiments are specified below.

In one possible embodiment, the switch element has a magnetic field sensor. The transmitter may only be activated if the transmitter is located in the B0 field of a magnetic resonance tomography system. The magnetic field sensor may be a Hall element or a Reed relay, for example.

In a further possible embodiment, the switch element includes a light sensor. Therefore, the transmitter may only then be activated if an image is captured, due to a light signal possibly modulated to a certain wavelength or also encoded. A battery of the transmitter may be preserved in this way, for example.

In one embodiment of the transmitter, the ratio of the frequency of the local oscillator to the frequency of the pilot tone signal is one to five or one to 25. In one embodiment, the frequency of the pilot signal amounts to 62.5 MHz.

If the magnetic resonance tomography system includes an internal frequency grid with frequencies equating to $n \times 2.5$ MHz, all harmonics of the oscillator signal accumulate in this grid. This is advantageous since the frequency plan of the MR system was designed such that the frequency plan does not include the receive or ZF band frequencies used from this grid. It is therefore excluded, due to the system, that the harmonics generated result in artifacts.

In one embodiment of a system including a transmitter and a magnetic resonance tomography system, the magnetic resonance tomography system has an internal pulsing. A frequency grid, in which all frequencies derived from the internal pulsing and multiples correspond in each case to frequencies of n times a basic frequency Fg, where n is a natural number, is used.

The frequency of the local oscillator of the transmitter and the frequency of the pilot tone signal are likewise a multiple of the basic frequency Fg (e.g., m times Fg, where m is likewise a natural number). The frequency of the pilot tone signal and of the local oscillator may also be different by, for example, as specified above, the pilot tone signal being obtained as a harmonic wave of the local oscillator signal. This provides that the transmitter also does not generate any interference signals on system-critical frequencies.

In one embodiment, the transmitter is arranged in a housing of an element of the magnetic resonance tomography system. This may be an element of the magnetic resonance tomography system, which, during an image capture, is arranged in close proximity to the patient or is in contact therewith (e.g., a local coil such as a spine coil or a body matrix, or a patient couch). In one embodiment, the transmitter may be provided with a separate housing.

In one embodiment, a shared housing with a local coil saves on an additional housing, and the arrangement of the transmitter is simplified.

Conversely, a separate housing allows for a more flexible choice of the position and may also be applied retrospectively in an existing magnetic resonance tomography system if the existing antennae and receivers and the controller are used to evaluate the signal.

BRIEF DESCRIPTION OF THE DRAWINGS

FIG. 5 shows a schematic representation of a flow diagram of one embodiment of a method.

DETAILED DESCRIPTION

Figure 1:
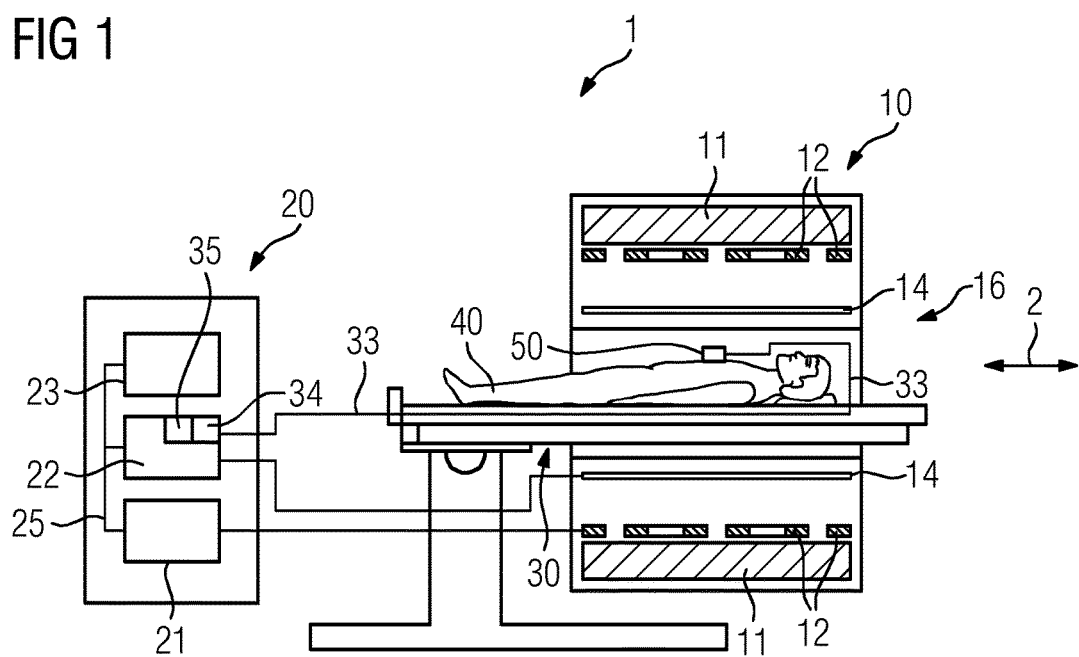
FIG. 1 shows an exemplary schematic representation of a magnetic resonance tomography system and a transmitter.

FIG. 1 shows a schematic representation of one embodiment of a magnetic resonance tomography system 1 with a transmitter 50.

A magnet unit 10 includes a field magnet 11 that generates a static magnetic field B0 for aligning nuclear spins of test persons or patients 40 in an examination volume. The examination volume is arranged in a leadthrough 16 that extends in a longitudinal direction 2 through the magnet unit 10. The field magnet 11 may be a superconducting magnet that may provide magnetic fields having a magnetic flux density of up to 3T, or even higher in the latest devices. For lower field strengths, however, permanent magnets or electromagnets with normal-conducting coils may also be used.

The magnet unit 10 includes gradient coils 12 that are configured to overlay the magnetic field B0 with variable magnetic fields in three spatial directions for the spatial differentiation of the captured imaging regions in the examination volume. The gradient coils 12 may be coils made of normal-conducting wires that may generate fields orthogonal to one another in the examination volume.

The magnet unit 10 likewise includes a body coil 14 configured to emit a high-frequency signal fed via a signal line into the examination volume, receive resonance signals emitted by the patient 40, and output the resonance signals via the signal line. The body coil 14 may be replaced by local coils 50 for the transmission of the high-frequency signal and/or the receipt thereof. The local coils are arranged in the leadthrough 16 close to the patient 40. In one embodiment, the local coil 50 may be configured to transmit and receive, and a body coil 14 may therefore be omitted.

A control unit 20 supplies the magnet unit 10 with the various signals for the gradient coils 12 and the body coil 14 and evaluates the signals received.

Thus, the control unit 20 includes a gradient control 21 configured to provide the gradient coils 12 with variable currents via feed lines. The variable currents provide the desired gradient fields in the examination volume on a temporally coordinated basis.

The control unit 20 includes a high-frequency unit 22 configured to generate a high-frequency pulse with a predetermined time characteristic, amplitude, and spectral power distribution to excite a magnetic resonance of the nuclear spins in the patient 40. In this case, pulse powers in the kilowatt range may be achieved.

In one embodiment of the transmitter 50, which is explained in more detail with reference to FIG. 2, and one embodiment of the magnetic resonance tomography system 1, the high-frequency unit 22 includes an oscillator 35 for generating an electrical signal with the pilot tone frequency. The high-frequency unit 22 includes an electro-optical converter 34 that generates a modulated light beam from the electrical signal with the pilot tone frequency. An LED or a semiconductor laser may be provided as a converter, for example.

The modulated light beam is then routed with a light guide 33 to the transmitter 50, which is explained as below with respect to FIG. 2. The transmitter 50 emits a pilot signal tone modulated in the light beam as an electromagnetic wave.

Figure 3:
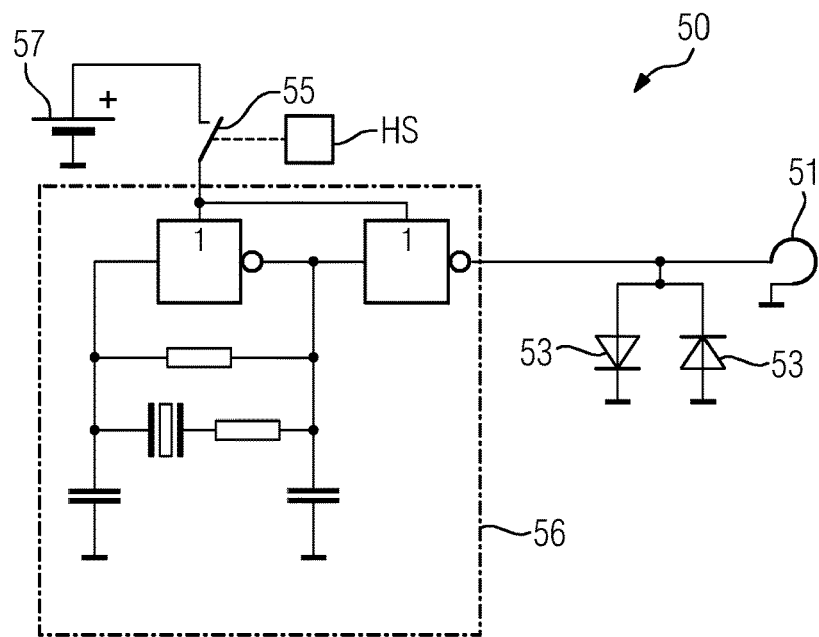
FIG. 3 shows a schematic representation of an embodiment of a transmitter.
Figure 4:
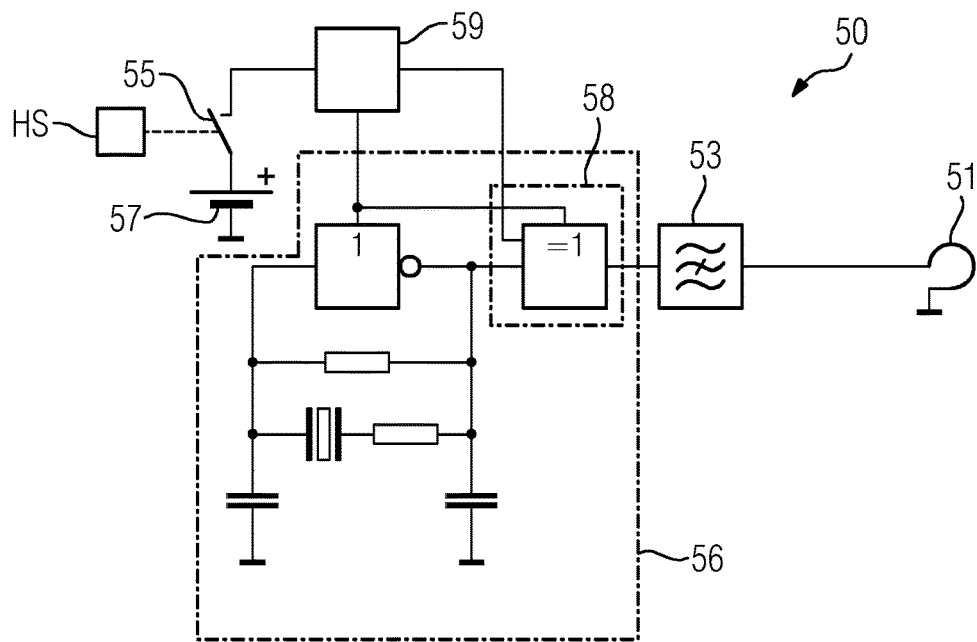
FIG. 4 shows a schematic representation of an embodiment of a transmitter.

The transmitters 50 according to FIGS. 3 and 4, which generate a pilot tone signal without the oscillator 35, the modulator 34, and the optical wave guide with a corresponding local oscillator 56, may, however, be provided.

The electromagnetic wave with the pilot tone signal frequency may also be most easily received with antennae such as, for example, the body coil 14 or also local coils that are already present in the leadthrough 16. A further evaluation may then take place using a receiver of the high-frequency unit 22. The pilot tone signal may have a frequency that differs from the Larmor frequency but still lies in an adjacent frequency range (e.g., varies by less than 1, 5 or 10 percent). By the frequency of the pilot tone signal varying from the Larmor frequency, the transmitter 50 may be decoupled from the antenna 51 by frequency-selective devices for the excitation pulse of the magnetic resonance tomography system 1, and thus, the transmitter 50 may be protected. In one embodiment, in this way, the movement identification with pilot tone may be continued during an excitation pulse.

Since the deviation of the frequency of the pilot tone signal from the Larmor frequency is not too great, the receiver of the magnetic resonance tomography system 1 may also be used to evaluate the pilot tone signal, since band-pass filters at the receive input may be used unchanged as a result of the minimal frequency distance, for example. These are often realized by a circuit that may not be adjusted arbitrarily in terms of its properties However, separate antennae and receivers may also be provided in the magnetic resonance tomography system 1 in order to receive the pilot tone signal. This permits a more flexible choice of the frequency used for the pilot tone signal, even at a greater distance from the Larmor frequency. This is advantageous when monitoring the movement during an image capture, since mutual interferences may be reduced and more easily faded out.

In one embodiment, the transmitter 50 may be provided in a housing of the patient couch 30 or in a local coil (not shown) of the magnetic resonance tomography system 1.

Figure 2:
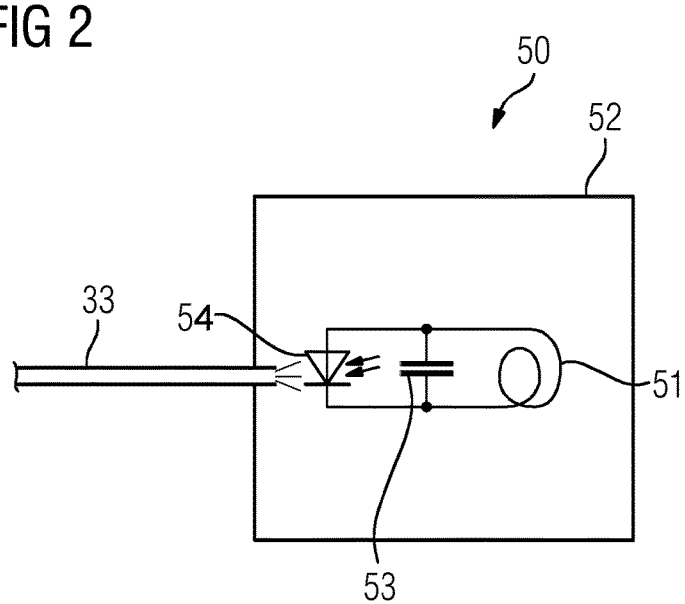
FIG. 2 shows a schematic representation of an embodiment of a transmitter.

FIG. 2 shows a schematic representation of one embodiment of a transmitter 50. A photo cell 54 is provided in a housing 52 that, in conjunction with an amplitude-modulated light beam supplied via the light guide 33, generates a photo voltage that generates a current in the electrically connected components. On account of the high-frequency amplitude modulation of the light beam, which is generated by the electro-optical converter 34 of the high-frequency unit 22 in FIG. 1, for example, the current provided in the transmitter 50 also has a high-frequency alternating current portion. The photo cell 54 is thus also simultaneously the power supply of the transmitter 50.

In the example shown, the antenna 51 is an antenna coil that, in conjunction with a capacitor as a decoupling element 53, forms a resonance circuit. The resonance circuit is matched to the frequency of the pilot tone signal, filters unwanted bandwidth portions due to non-linearities out of the transmitted signal, and, provided the Larmor frequency and frequency of the pilot tone signal are selected at a suitable distance, at the same time prevents a strong decoupling of the excitation pulse in the transmitter 50, which may otherwise result in the photocell 54 being destroyed.

Instead of the capacitor as a decoupling element 53, more complex filters and band-pass filters may also be provided (e.g., up to quartz filters or surface acoustic wave filters).

Depending on the frequency of the pilot tone signal, other antenna types such as, for example, dipole or strip lines may be provided.

In one embodiment, in the transmitter in FIG. 2, this may be arranged in a patient couch 30 or a local coil without a separate housing.

FIG. 3 shows a further embodiment of a transmitter 50. The same objects are again provided with the same reference characters here.

The housing 52 is not shown in FIG. 3, even if the transmitter 50 in FIG. 3, on account of the absence of external terminals, is appropriate for an independent design with a separate housing. The transmitter 50, however, may likewise be installed in a local coil or patient couch 30, for example.

The transmitter 50 in FIG. 3 differs from the transmitter in FIG. 2 in that the transmitter 50 is not connected via a light guide 33 to another apparatus. Instead, the transmitter 50 in FIG. 3 includes an independent power supply 57 in the form of a battery. The transmitter 50 includes a local oscillator 56 that is realized by a quartz and logic gates. The use of a quartz as a frequency-determining element provides that the frequency of the pilot tone signal is kept constant provided a movement of the patient 40 is not simulated by frequency fluctuations in the time frame of a typical movement of the patient 40 in the seconds range by interferences that change with the frequency.

The power supply 57 is connected via a switch element 55 to the local oscillator 56. The switch element 55 may be activated in a magnetic field-dependent manner. In the simplest case, this may be a Reed relay, but may also be a switch that is activated by a Hall probe HS. In this way, the local oscillator 56 is only activated if the transmitter 50 is located in the leadthrough of the magnet unit 10. As a result of this, the useful life of the transmitter 50 is extended. In one embodiment, an optical sensor may be provided, and an optical signal (e.g., a modulated light source in the leadthrough 16) may be used for activation.

Two antiparallel-connected diodes that are switched to ground between the output of the local oscillator 56 and the antenna 51 are provided as decoupling elements 53 in FIG. 3. This thus provides that a voltage induced into the antenna by an excitation pulse of the magnetic resonance tomography system is limited to below the forward voltage. Here, on account of the proximity, a pilot tone signal, which may be generated with a voltage of 0.7 Volt, is completely adequate for capturing movements. For example, the SAR limit value for the MR measurement is not restricted further by the low transmit power of the transmitter 50.

FIG. 4 shows a further embodiment of a transmitter 50. The same subject matters are also shown here with the same reference characters.

The transmitter 50 in FIG. 4 differs from the transmitter 50 in FIG. 3 in that the power supply 57 is embodied by a rechargeable battery or accumulator or as a super capacitor. A charge manager 59 that, for example, identifies an imminent operational failure of the transmitter 50 based on the voltage of the battery may be provided. To provide that this information may also be captured outside of the transmitter 50, the transmitter 50 also has a modulator 58 that modulates the pilot tone signal as a function of the voltage of the battery. The evaluation of the pilot tone signal in the controller 23 of the magnetic resonance tomography system 1 may then demodulate the pilot tone signal and output a warning to the user. Modulation methods such as amplitude modulation, frequency modulation, or phase modulation may also be provided in conjunction with digital encoding. A modulation method that may differ from the effect of a movement of the patient 40 (e.g., a phase modulation) may be used.

The transmitter 50 in FIG. 4 also differs from the transmitter in FIG. 3 in that a band-pass filter is arranged as a decoupling element 53 between the local oscillator 56 and the antenna 51. The band-pass filter has a different conductance for signals with a different frequency, so that when selecting a different frequency of the pilot tone signal and Larmor frequency and suitable frequency characteristics of the band-pass filter, the pilot tone signal is only damped marginally (e.g., damped less than 2, 6 or 12 dB), while an excitation pulse received by way of the antenna 51 is damped by more than 20, 40 or 60 dB. The local oscillator may be protected in this way. Contrary to limiting diodes, the band-pass filter does not restrict the level of the pilot tone signal to the forward voltage, but instead also permits higher powers. At the same time, the band-pass filter improves the spectral quality (e.g., bandwidth, harmonic waves) of the pilot tone signal. The bandpass filter may be provided, for example, from inductance and capacitances, as quartz filters or surface acoustic wave filters.

The band-pass filter also allows, for example, a digital oscillating circuit with gates to be realized as an oscillator and a harmonic wave to be selected via the bandpass filter as a pilot tone signal. This advantageously enables a simple and energy-saving transmitter with a high signal strength.

In one embodiment, a high- or low-pass filter may be provided instead of the band-pass filter. The frequency of the pilot tone signal is to be in the forward range, and the characteristic curve of the filter between the pilot tone signal and the Larmor frequency is to be sufficiently steep.

FIG. 5 shows a flow diagram of one embodiment of a method of identifying movement using the transmitter 50.

In act S10 of the method, the transmitter 50 is positioned in close proximity to the heart or the lungs of the patient. For example, the transmitter 50 is placed on the chest of the patient. In one embodiment, the transmitter 50 may be integrated into a patient couch or a spine matrix or another local coil and thus may extend below or on the chest.

In act S20, the transmitter 50 transmits a pilot tone signal. In one embodiment, the transmitter 50 may be activated by the B0 field of the magnetic resonance tomography system 1. However, a manual activation, an activation via the light guide 33 from FIG. 1, or an encoded optical signal may be provided.

In act S30, the magnetic resonance tomography system receives the pilot tone signal. Either the existing antennae (e.g., body coil, local coil) and receivers may also be provided, or may have separate receivers and antennae for the pilot signal.

In act S40, a controller of the magnetic resonance tomography system analyzes movement-dependent changes in the received pilot tone signal by a signal analysis. For example, a pattern recognition may filter out and identify typical rhythms in breathing and heartbeat from the received pilot tone signal. In one embodiment, a separate identification unit may be provided in the magnetic resonance tomography system.

Although the invention has been illustrated and described in greater detail by the exemplary embodiments, the invention is not limited by the examples disclosed. The person skilled in the art will be able to derive other variations on this basis without moving beyond the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmitter for pilot tone navigation in a magnetic resonance tomography system, the transmitter comprising:
   a power supply comprising a photo element;
   an antenna, wherein the transmitter is configured to transmit a pilot tone signal via the antenna; and
   a decoupling element for decoupling a transmitter output from signals that the antenna receives in the magnetic resonance tomography system by excitation pulses of the magnetic resonance tomography system.

2. The transmitter of claim 1, wherein the decoupling element comprises a diode or another component with a non-linear characteristic curve.

3. The transmitter of claim 1, wherein the decoupling element comprises an element with a frequency-dependent characteristic curve.

4. The transmitter of claim 1, wherein the photo element is configured to:
   receive a signal of a high-frequency modulated light source; and
   convert the signal into a high-frequency alternating current, and
   wherein the transmitter is configured, by passive components, to emit at least one part of energy of a high-frequency alternating current as an electromagnetic alternating field with a same frequency via the antenna.

5. The transmitter of claim 1, wherein the transmitter comprises a signal link that is coupleable to the magnetic resonance tomography system, and
   wherein the transmitter is configured to convey an item of identification using a signal link to the magnetic resonance tomography system.

6. The transmitter of claim 1, wherein the transmitter comprises a frequency-stable local oscillator.

7. The transmitter of claim 1, wherein the transmitter comprises a modulator configured to modulate a signal transmitted via the antenna as a function of a status parameter of the transmitter.

8. The transmitter of claim 1, wherein the transmitter comprises a switch element configured to activate the transmitter as a function of a surrounding area parameter.

9. The transmitter of claim 8, wherein the switch element comprises a magnetic field sensor.

10. The transmitter of claim 8, wherein the switch element comprises a light sensor.

11. The transmitter of claim 6, wherein a ratio of a frequency of the local oscillator to a frequency of the pilot tone signal is one to five or one to twenty five.

12. The transmitter of claim 1, wherein the transmitter is arranged in a housing of an element of the magnetic resonance tomography system.

13. A system comprising:
   a transmitter for pilot tone navigation in a magnetic resonance tomography system, the transmitter comprising:
      a power supply comprising a photo element;
      an antenna, wherein the transmitter is configured to transmit a pilot tone signal via the antenna; and
      a decoupling element for decoupling a transmitter output from signals that the antenna receives in the magnetic resonance tomography system by excitation pulses of the magnetic resonance tomography system; and
   the magnetic resonance tomography system having an internal pulsing and frequencies derived from the internal pulsing,
   wherein multiples correspond in each case to frequencies of n times a basic frequency Fg with n as a natural number, and
   wherein the frequency of the local oscillator of the transmitter and the frequency of the pilot tone signal correspond to frequencies of m times the basic frequency Fg with m as a natural number.

14. The system of claim 13, wherein the decoupling element comprises a diode or another component with a non-linear characteristic curve.

15. The system of claim 13, wherein the decoupling element comprises an element with a frequency-dependent characteristic curve.

16. A transmitter for pilot tone navigation in a magnetic resonance tomography system, the transmitter comprising:
   a power supply;
   an antenna, wherein the transmitter is configured to transmit a pilot tone signal via the antenna; and
   a decoupling element for decoupling a transmitter output from signals that the antenna receives in the magnetic resonance tomography system by excitation pulses of the magnetic resonance tomography system,
   wherein the transmitter comprises a switch element configured to activate the transmitter as a function of a surrounding area parameter, and
   wherein the switch element comprises a magnetic field sensor.

17. A transmitter for pilot tone navigation in a magnetic resonance tomography system, the transmitter comprising:
   a power supply;
   an antenna, wherein the transmitter is configured to transmit a pilot tone signal via the antenna; and
   a decoupling element for decoupling a transmitter output from signals that the antenna receives in the magnetic resonance tomography system by excitation pulses of the magnetic resonance tomography system,
   wherein the transmitter comprises a switch element configured to activate the transmitter as a function of a surrounding area parameter, and
   wherein the switch element comprises a light sensor.

* * * * *